US012660459B2

(12) United States Patent
Wu et al.

(10) Patent No.: US 12,660,459 B2
(45) Date of Patent: Jun. 16, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Yuan Wu, Wuhan (CN); Tingting Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 763 days.

(21) Appl. No.: 17/758,073

(22) PCT Filed: Jun. 6, 2022

(86) PCT No.: PCT/CN2022/097081

§ 371 (c)(1),
(2) Date: Jun. 28, 2022

(87) PCT Pub. No.: WO2023/221191

PCT Pub. Date: Nov. 23, 2023

(65) Prior Publication Data

US 2024/0179990 A1　May 30, 2024

(30) Foreign Application Priority Data

May 17, 2022　(CN) .......................... 202210541195.5

(51) Int. Cl.
*H10K 59/35* (2023.01)
*H10K 59/121* (2023.01)

(52) U.S. Cl.
CPC ......... *H10K 59/353* (2023.02); *H10K 59/121* (2023.02); *H10K 59/352* (2023.02)

(58) Field of Classification Search
None
See application file for complete search history.

(56) References Cited

U.S. PATENT DOCUMENTS

2013/0113839 A1* 5/2013 Huang .................. G02B 30/34
345/55
2020/0113069 A1 4/2020 Her et al.
(Continued)

FOREIGN PATENT DOCUMENTS

CN　105096765 A　11/2015
CN　105894973 A　8/2016
(Continued)

OTHER PUBLICATIONS

Chinese Office Action issued in corresponding Chinese Patent Application No. 202210541195.5 dated Apr. 19, 2024, pp. 1-8.
(Continued)

*Primary Examiner* — Julio J Maldonado
*Assistant Examiner* — Pinaki Das
(74) *Attorney, Agent, or Firm* — PV IP PC; Peter Stecher; Wei Te Chung

(57) ABSTRACT

The present disclosure provides a display panel and a display device. The display panel includes a pixel group arranged in an array, where the pixel group includes: a first pixel unit, a partial region of which is provided with a first sub-pixel; a second pixel unit, a partial region of which is provided with a second sub-pixel; and a third pixel unit, a partial region of which is provided with a third sub-pixel; where the first sub-pixel, the second sub-pixel, and the third
(Continued)

sub-pixel have different colors, and any one of the first sub-pixel, the second sub-pixel, and the third sub-pixel is adjacent to other sub-pixels.

12 Claims, 4 Drawing Sheets

(56) References Cited

U.S. PATENT DOCUMENTS

| | | | | |
|---|---|---|---|---|
| 2021/0376008 A1* | 12/2021 | Tan | ................ | G09G 3/3208 |
| 2023/0276674 A1* | 8/2023 | Bok | ................ | H10K 59/353 |
| | | | | 257/40 |

FOREIGN PATENT DOCUMENTS

| | | |
|---|---|---|
| CN | 105957877 A | 9/2016 |
| CN | 107621716 A | 1/2018 |
| CN | 109599053 A | 4/2019 |
| CN | 109637362 A | 4/2019 |
| CN | 109830514 A | 5/2019 |
| CN | 109887958 A | 6/2019 |
| CN | 110335892 A | 10/2019 |
| CN | 111192902 A | 5/2020 |
| CN | 112041992 A | 12/2020 |
| CN | 112071887 A | 12/2020 |
| CN | 112436032 A | 3/2021 |
| CN | 113380143 A | 9/2021 |
| CN | 114242760 A | 3/2022 |

OTHER PUBLICATIONS

Chinese Office Action issued in corresponding Chinese Patent Application No. 202210541195.5 dated Aug. 31, 2024, pp. 1-8.
International Search Report in International application No. PCT/CN2022/097081, mailed on Dec. 16, 2022.
Written Opinion of the International Search Authority in International application No. PCT/CN2022/097081, mailed on Dec. 16, 2022.

* cited by examiner

DISPLAY PANEL AND DISPLAY DEVICE

TECHNICAL FIELD

The present disclosure relates to a display technology field, and in particular to a display panel and a display device.

BACKGROUND

With continuous innovation and improvement of AMO-LED (Active Matrix Organic Light Emitting Diode) display technology, design schemes of a panel tend to be diversified, in which CUP (Camera Under Panel) have many advantages such as canceling of a camera hole and a high screen-to-body ratio and is highly expected by a customer.

According to schemes of the camera under the screen, two current mainstream methods and theirs defects are shown as follows: for the first scheme, directly reducing pixels (scooping out some pixels), and its main defect is that if the pixels are scooped out too much, the display effect will be affected, and if the pixels are scooped out too little, a transmittance of incident light will be affected and the effect will be poor; and for the second scheme, the pixels are directly made small without being scooped out on the basis of the original pixel, and its main defect is that a transmittance is poor because the pixel is not scooped out, and since smaller pixels require a higher light emitting efficiency, after long-time use, it will result in a faster brightness attenuation in the CUP region than in the Normal region. Therefore, how to ensure a transmittance of an under-display camera and reduce the light emitting attenuation as much as possible becomes an urgent problem to be solved.

Technical Problems

Problems to be solved by embodiments of the present disclosure are how to ensure a transmittance of an under-display camera and reduce the light emitting attenuation as much as possible

Technical Solutions to the Problem

Embodiments of the present disclosure provide a display panel and a display device, in which an effective light emitting area of a pixel can be adjusted by setting a ratio of an area occupied by a sub-pixel in each pixel unit, which ensures a light emitting effect and guarantees a transmittance.

In a first aspect, an embodiment of the present disclosure provides a display panel comprising a plurality of pixel groups arranged in an array, wherein each of the pixel groups comprises:

a first pixel unit, a partial region of which is provided with a first sub-pixel;

a second pixel unit, a partial region of which is provided with a second sub-pixel; and a third pixel unit, a partial region of which is provided with a third sub-pixel;

wherein the first sub-pixel, the second sub-pixel, and the third sub-pixel have different colors, and any one of the first sub-pixel, the second sub-pixel, and the third sub-pixel is adjacent to other sub-pixels; wherein the first sub-pixel, the second sub-pixel, and the third sub-pixel have the same shape and area; wherein each of the pixel groups is equally divided into the first pixel unit, the second pixel unit, and the third pixel unit.

In some embodiments, other partial region of the first pixel unit is provided with a complementing second sub-pixel and a complementing third sub-pixel; other partial region of the second pixel unit is provided with a compensating first sub-pixel and a compensating third sub-pixel; and other partial region of the third pixel unit is provided with a padding first sub-pixel and a padding second sub-pixel.

In some embodiments, the complementing second sub-pixel of the first pixel unit, the compensating third sub-pixel of the second pixel unit, and the padding first sub-pixel of the third pixel unit have the same shape and area; and the complementing third sub-pixel of the first pixel unit, the compensating first sub-pixel of the second pixel unit, and the padding second sub-pixel of the third pixel unit have the same shape and area.

In some embodiments, another partial region of the first pixel unit is disposed as a blank region; another partial region of the second pixel unit is disposed as a blank region; and another partial region of the third pixel unit is disposed as a blank region.

In some embodiments, the pixel groups comprise a first pixel group and a second pixel group;

wherein other partial region of the first pixel unit of the first pixel group is provided with a complementing second sub-pixel and a complementing third sub-pixel; other partial region of the second pixel unit of the first pixel group is provided with a compensating first sub-pixel and a compensating third sub-pixel; and other partial region of the third pixel unit of the first pixel group is provided with a padding first sub-pixel and a padding second sub-pixel; and wherein another partial region of the first pixel unit of the second pixel group is disposed as a blank region; another partial region of the second pixel unit of the second pixel group is disposed as a blank region; and another partial region of the third pixel unit of the second pixel group is disposed as a blank region.

In some embodiments, the first sub-pixel of the first pixel unit of the first pixel group and the first sub-pixel of the first pixel unit of the second pixel group have the same shape and area; the second sub-pixel of the second pixel unit of the first pixel group and the second sub-pixel of the second pixel unit of the second pixel group have the same shape and area; and the third sub-pixel of the third pixel unit of the first pixel group and the third sub-pixel of the third pixel unit of the second pixel group have the same shape and area.

In some embodiments, at least two sub-pixels of the first pixel unit of the first pixel group have different shapes; at least two sub-pixels of the second pixel unit of the first pixel group have different shapes; and at least two sub-pixels of the third pixel unit of the first pixel group have different shapes.

In some embodiments, the sub-pixel comprises a light emitting region and a pixel connection region connected to an adjacent sub-pixel, wherein the pixel connection region has a size corresponding to a shape of the sub-pixel.

In some embodiments, all of the first sub-pixel, the compensating first sub-pixel, and the padding first sub-pixel of the first pixel group are sub-pixels having the same color; all of the second sub-pixel, the complementing second sub-pixel, and the padding second sub-pixel of the first pixel group are sub-pixels having the same color; and all of the third sub-pixel, the complementing third sub-pixel, and the padding third sub-pixel of the first pixel group are sub-pixels having the same color.

In some embodiments, an outer contour of each of the pixel groups is set as a regular hexagon.

In some embodiments, the plurality of pixel groups are arranged in a honeycomb dot-like array.

In some embodiments, the first sub-pixel is a red sub-pixel, the second sub-pixel is a green sub-pixel, and the third sub-pixel is a blue sub-pixel.

In a second aspect, an embodiment of the present disclosure provides a display panel comprising a plurality of pixel groups arranged in an array, wherein the pixel groups comprise:

a first pixel unit, a partial region of which is provided with a first sub-pixel;

a second pixel unit, a partial region of which is provided with a second sub-pixel; and a third pixel unit, a partial region of which is provided with a third sub-pixel;

wherein the first sub-pixel, the second sub-pixel, and the third sub-pixel have different colors, and any one of the first sub-pixel, the second sub-pixel, and the third sub-pixel is adjacent to other sub-pixels.

In some embodiments, the first sub-pixel, the second sub-pixel, and the third sub-pixel have the same shape and area.

In some embodiments, other partial region of the first pixel unit is provided with a complementing second sub-pixel and a complementing third sub-pixel; other partial region of the second pixel unit is provided with a compensating first sub-pixel and a compensating third sub-pixel; and other partial region of the third pixel unit is provided with a padding first sub-pixel and a padding second sub-pixel.

In some embodiments, the complementing second sub-pixel of the first pixel unit, the compensating third sub-pixel of the second pixel unit, and the padding first sub-pixel of the third pixel unit have the same shape and area; and the complementing third sub-pixel of the first pixel unit, the compensating first sub-pixel of the second pixel unit, and the padding second sub-pixel of the third pixel unit have the same shape and area.

In some embodiments, another partial region of the first pixel unit is disposed as a blank region; another partial region of the second pixel unit is disposed as a blank region; and another partial region of the third pixel unit is disposed as a blank region.

In some embodiments, the pixel groups comprise a first pixel group and a second pixel group;

wherein other partial region of the first pixel unit of the first pixel group is provided with a complementing second sub-pixel and a complementing third sub-pixel; other partial region of the second pixel unit of the first pixel group is provided with a compensating first sub-pixel and a compensating third sub-pixel; and other partial region of the third pixel unit of the first pixel group is provided with a padding first sub-pixel and a padding second sub-pixel; and wherein another partial region of the first pixel unit of the second pixel group is disposed as a blank region; another partial region of the second pixel unit of the second pixel group is disposed as a blank region; and another partial region of the third pixel unit of the second pixel group is disposed as a blank region.

In some embodiments, the first sub-pixel of the first pixel unit of the first pixel group and the first sub-pixel of the first pixel unit of the second pixel group have the same shape and area; the second sub-pixel of the second pixel unit of the first pixel group and the second sub-pixel of the second pixel unit of the second pixel group have the same shape and area; and the third sub-pixel of the third pixel unit of the first pixel group and the third sub-pixel of the third pixel unit of the second pixel group have the same shape and area.

In some embodiments, at least two sub-pixels of the first pixel unit of the first pixel group have different shapes; at least two sub-pixels of the second pixel unit of the first pixel group have different shapes; and at least two sub-pixels of the third pixel unit of the first pixel group have different shapes.

In some embodiments, the sub-pixel comprises a light emitting region and a pixel connection region connected to an adjacent sub-pixel, wherein the pixel connection region has a size corresponding to a shape of the sub-pixel.

In some embodiments, all of the first sub-pixel, the compensating first sub-pixel, and the padding first sub-pixel of the first pixel group are sub-pixels having the same color; all of the second sub-pixel, the complementing second sub-pixel, and the padding second sub-pixel of the first pixel group are sub-pixels having the same color; and all of the third sub-pixel, the complementing third sub-pixel, and the padding third sub-pixel of the first pixel group are sub-pixels having the same color.

In some embodiments, an outer contour of each of the pixel groups is set as a regular hexagon.

In some embodiments, each of the pixel groups is equally divided into the first pixel unit, the second pixel unit, and the third pixel unit.

In some embodiments, the plurality of pixel groups are arranged in a honeycomb dot-like array.

In some embodiments, the first sub-pixel is a red sub-pixel, the second sub-pixel is a green sub-pixel, and the third sub-pixel is a blue sub-pixel.

In a third aspect, an embodiment of the present disclosure provides a display device comprising the display panel according to any one of the foregoing.

Beneficial Effects

Embodiments of the present disclosure provide the display panel and the display device, in which each of the sub-pixels provided in each of the pixel units is used for light emitting display, the region where no sub-pixel is provided can be used for improving the transmittance, and the sub-pixel occupies only a partial region of corresponding pixel unit. Therefore, the effective light emitting area of the pixel can be adjusted by setting a ratio of an area occupied by a sub-pixel in each pixel unit, which ensures a light emitting effect and guarantees a transmittance.

BRIEF DESCRIPTION OF THE DRAWINGS

Technical solutions and other beneficial effects of the present disclosure are apparent below from detailed description of the embodiments of the present disclosure in combination with the accompanying drawings.

REFERENCE SIGNS

Figure 1:
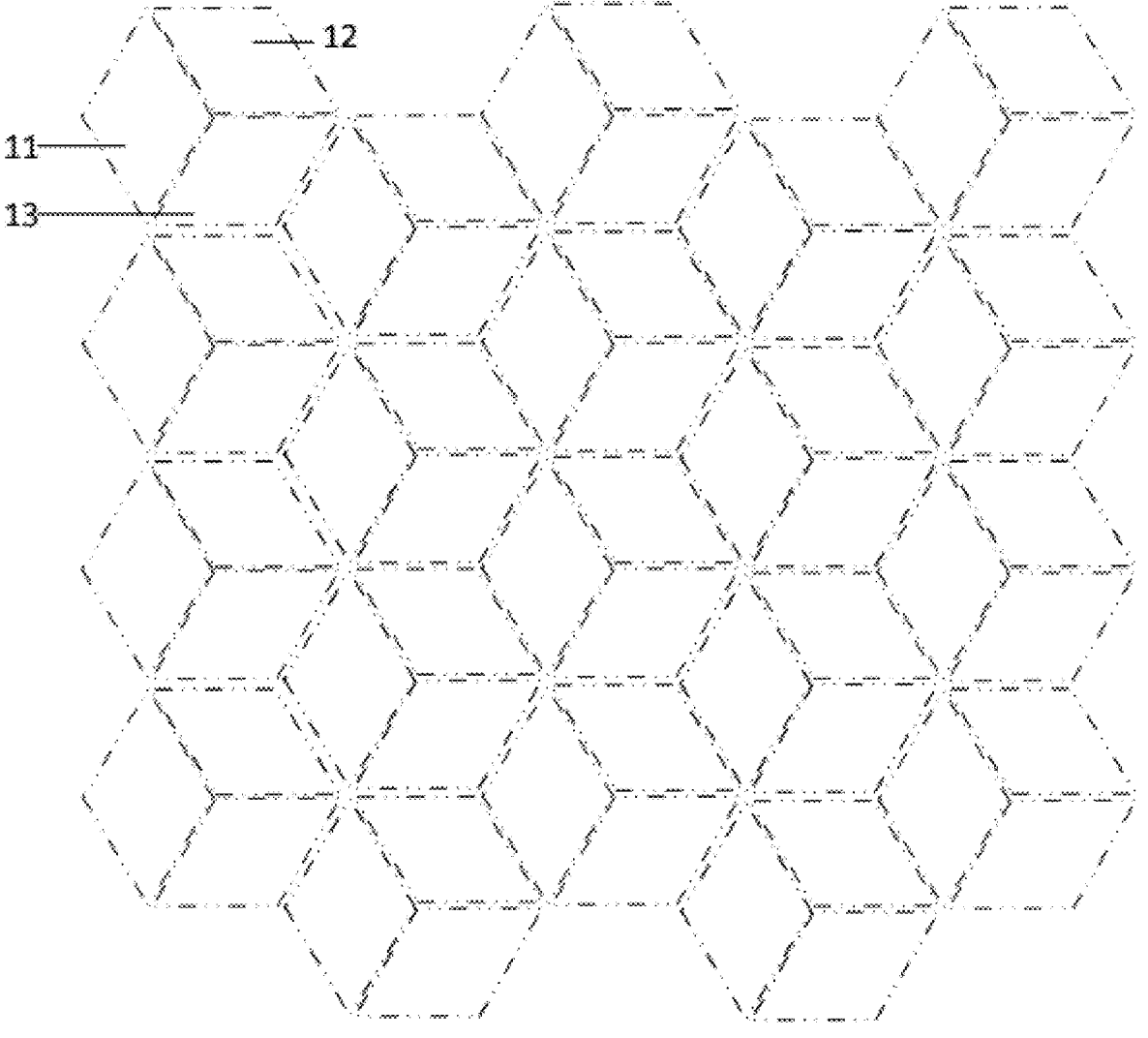
FIG. 1 is a schematic structural diagram of a display panel according to an embodiment of the present disclosure.

11 first pixel unit of pixel group; 12 second pixel unit of pixel group; 13 third pixel unit of pixel group; 21 first pixel unit of first pixel group; 211 first sub-pixel of first pixel group; 212 complementing second sub-pixel of first pixel group; 213 complementing third sub-pixel of first pixel group; 22 second pixel unit of first pixel group; 221 second sub-pixel of first pixel group; 222 compensating first sub-pixel of first pixel group; 223 compensating third sub-pixel of first pixel group; 23 third pixel unit of first pixel group; 231 third sub-pixel of first pixel group; 232 padding first sub-pixel of first pixel group; 233 padding second sub-pixel of first pixel group; 31 first pixel unit of second pixel group; 311 first sub-pixel of second pixel group; 32 second pixel unit of second pixel group; 321 second sub-pixel of second pixel group; 33 third pixel unit of second pixel group; and 331 third sub-pixel of second pixel group.

EMBODIMENTS OF THE PRESENT DISCLOSURE

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

It should be noted that in the description of the present disclosure, unless otherwise clearly defined and limited, the terms "mounted", "connected/coupled", and "connection" should be interpreted broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those ordinary skilled in the art can understand the specific meanings of the above terms in the present disclosure according to specific situations.

It should be noted that in the present disclosure, unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

Referring to FIG. 1, an embodiment of the present disclosure provides a display panel including a plurality of pixel groups arranged in an array, where each pixel group includes a first pixel unit 11, a second pixel unit 12, and a third pixel unit 13. A partial region of the first pixel unit 11 is provided with a first sub-pixel (not shown), a partial region of the second pixel unit 12 is provided with a second sub-pixel (not shown), and a partial region of the third pixel unit 13 is provided with a third sub-pixel (not shown). It should be noted that the shapes of the first pixel unit 11, the second pixel unit 12, and the third pixel unit 13 are not limited in the embodiment. Similarly, the shapes of the first sub-pixel, the second sub-pixel, and the third sub-pixel in the corresponding pixel units are not limited in the embodiment.

The first sub-pixel, the second sub-pixel, and the third sub-pixel have different colors. For example, the first sub-pixel is a red sub-pixel, the second sub-pixel is a green sub-pixel, and the third sub-pixel is a blue sub-pixel.

Any one of the first sub-pixel, the second sub-pixel, and the third sub-pixel is adjacent to the other two sub-pixels, and the shapes of the first sub-pixel, the second sub-pixel, and the third sub-pixel are not affected. For example, if all of the first sub-pixel, the second sub-pixel, and the third sub-pixel have quadrilateral shapes, the first side of the first sub-pixel is adjacent to the second sub-pixel, the second side of the first sub-pixel adjacent to the first side is adjacent to the third sub-pixel, and the second sub-pixel and the third sub-pixel are configured in a manner similar to the first sub-pixel, which is not described repeatedly herein. Similarly, if all of the first sub-pixel, the second sub-pixel, and the third sub-pixel have elliptical shapes, one end of each of the first sub-pixel, the second sub-pixel, and the third sub-pixel is clustered at a point such that any one of the first sub-pixel, the second sub-pixel, and the third sub-pixel is adjacent to the other two sub-pixels.

It should be noted that the effective light emitting area of the pixel can be adjusted by setting the ratio of the area occupied by the sub-pixels (e.g., the first sub-pixel, the second sub-pixel, and the third sub-pixel) in its pixel unit (e.g., the first pixel unit 11, the second pixel unit 12, and the third pixel unit 13), and the light emitting effect can be ensured while ensuring the transmittance.

In one embodiment, the outer contours of the pixel groups are set as regular hexagons, the plurality of pixel groups arranged in the array are configured in a honeycomb dot-like array, and the regular hexagons have the outer contours sharing one side with adjacent pixel groups. It should be noted that the pixel group with the regular hexagon as the outer contour in the present embodiment is arrayed as a minimum repeating unit, and the arrangement that the outer contour of the pixel group is regular hexagon does not mean that all the sub-pixels of the pixel group are contained and filled with the entire outer contour. There is a region where no sub-pixel is arranged in the pixel group, and the position of the region where no sub-pixel is arranged in the pixel group is not limit herein.

In the embodiment, the pixel groups of which the outer contours are set as regular hexagons are arranged in a honeycomb dot-like array, and such a structure is uniform and stable. Meanwhile, the three primary colors of red, green and blue can be more uniformly distributed, so that the display effect is stable.

In one embodiment, each of the pixel groups is equally divided into the first pixel unit 11, the second pixel unit 12, and the third pixel unit 13. The first pixel unit 11, the second pixel unit 12, and the third pixel unit 13 are respectively provided with one sub-pixel. Each of the pixel groups is equally divided into the three pixel units. Then, parameters such as shapes and areas of different sub-pixel within the pixel groups are set to be the same, and the display effect is stable.

Each of the pixel groups of which the outer contour is regular hexagon is equally divided into the first pixel unit 11, the second pixel unit 12, and the third pixel unit 13. In order to ensure that the first pixel unit 11, the second pixel unit 12, and the third pixel unit 13 are adjacent to each other, and further ensure that the first sub-pixel of the first pixel unit 11, the second sub-pixel of the second pixel unit 12, and the third sub-pixel of the third pixel unit 13 are adjacent to each other, the outer contours of the first pixel unit 11, the second pixel unit 12, and the third pixel unit 13 are set as parallelograms. In the outer contours of the first pixel unit 11, the second pixel unit 12, and the third pixel unit 13, the positions and shapes of the corresponding first sub-pixel, second sub-pixel, and third sub-pixel are not specifically limited, and it does not mean that the first sub-pixel, the second sub-pixel, and the third sub-pixel fill the corresponding first pixel unit 11, second pixel unit 12, and third pixel unit 13, respectively.

In one embodiment, the first sub-pixel, the second sub-pixel, and the third sub-pixel have the same shape and area. That is, the light emitting shape and the effective light emitting area of the first sub-pixel, the second sub-pixel, and the third sub-pixel are the same in one minimum repeating unit, i.e., the pixel group, so that the light emitting shape and the effective light emitting area of the first sub-pixel, the second sub-pixel, and the third sub-pixel are the same in the entire display panel.

It should be noted that, since the pixel groups in the entire display panel are arranged in a honeycomb dot-like array while the outer contours of the pixel groups are set as regular hexagons, the edges of the pixel groups which are arranged in the array are not flush. Therefore, a portion of the pixel groups on the edges is only half due to boundary segmentation, that is, certain pixel unit of all of the first pixel unit 11, the second pixel unit 12, and the third pixel unit 13 in the portion of the pixel groups on the edge is complete, and another pixel unit is cut off by the boundary, and the last pixel unit is cut off half by the boundary. Therefore, the last pixel unit reduces the originally contained sub-pixels equally to the remaining half, thereby finally realizing the flush boundary.

Figures 2, 3:
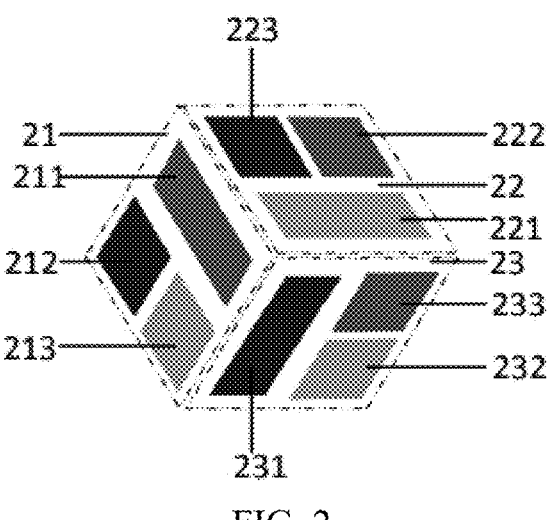
FIG. 2 is a schematic structural diagram of a first pixel group according to an embodiment of the present disclosure.
FIG. 3 is a schematic diagram of a display panel composed of a first pixel group according to an embodiment of the present disclosure.

In one embodiment, as shown in FIGS. 2 and 3, the pixel group is defined as a first pixel group, where a partial region of the first pixel unit 21 of the first pixel group is provided with a first sub-pixel 211, and other partial region of the first pixel unit 21 of the first pixel group except the partial region provided with the first sub-pixel 211 is provided with a complementing second sub-pixel 212 and a complementing third sub-pixel 213. A partial region of the second pixel unit 22 of the first pixel group is provided with a second sub-pixel 221, and other partial region of the second pixel unit 22 of the first pixel group except the partial region provided with the second sub-pixel 221 is provided with a compensating first sub-pixel 222 and a compensating third sub-pixel 223. A partial region of the third pixel unit 23 of the first pixel group is provided with a third sub-pixel 231, and other partial region of the third pixel unit 23 of the first pixel group except the partial region provided with the third sub-pixel 231 is provided with a padding first sub-pixel 232 and a padding second sub-pixel 233. That is, each of the first pixel unit 21, the second pixel unit 22, and the third pixel unit 23 of the first pixel group includes all of three types of sub-pixels, and each of sub-pixels in the first pixel unit 21, the second pixel unit 22, and the third pixel unit 23 may have the same or different angles and colors.

The complementing second sub-pixel 212, the padding second sub-pixel 233, and the second sub-pixel 221 are sub-pixels having the same color, but parameters such as the shape and area of the three sub-pixels may be the same or different from each other. The complementing third sub-pixel 213, the compensating third sub-pixel 223, and the third sub-pixel 231 are sub-pixels having the same color, but parameters such as the shape and area of the three sub-pixels may be the same or different from each other. The compensating first sub-pixel 222, the padding first sub-pixel 232, and the first sub-pixel 211 are sub-pixels having the same color, but parameters such as the shape and area of the three sub-pixels may be the same or different from each other.

In the embodiment, different display requirements are met by adjusting parameters such as the shape and area of each of the sub-pixels (e.g., the first sub-pixel 211, the second sub-pixel 221, and the third sub-pixel 231) in each pixel unit (e.g., the first pixel unit 21, the second pixel unit 22, and the third pixel unit 23).

In an embodiments, when the first pixel unit 21, the second pixel unit 22, and the third pixel unit 23 of the first pixel group all include three sub-pixels, the first sub-pixel 211 of the first pixel unit 21, the second sub-pixel 221 of the second pixel unit 22, and the third sub-pixel 231 of the third pixel unit 23 have the same shape and area, the complementing second sub-pixel 212 of the first pixel unit 21, the compensating third sub-pixel 223 of the second pixel unit 22, and the padding first sub-pixel 232 of the third pixel unit 23 have the same shape and area, and the complementing third sub-pixel 213 of the first pixel unit 21, the compensating first sub-pixel 222 of the second pixel unit 22, and the padding second sub-pixel 233 of the third pixel unit 23 have the same shape and area. That is, the total shapes and areas of the sub-pixels with different colors contained in the entire pixel group is the same, so that each of the pixel groups emits light uniformly.

Figures 4, 5:
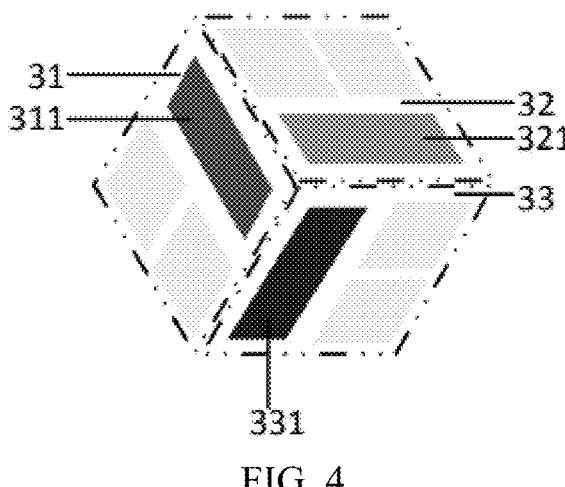
FIG. 4 is a schematic structural diagram of a second pixel group according to an embodiment of the present disclosure.
FIG. 5 is a schematic diagram of a display panel composed of a second pixel group according to an embodiment of the present disclosure.

In one embodiment, as shown in FIGS. 4 and 5, the pixel group is defined as a second pixel group, where a partial region of the first pixel unit 31 of the second pixel group is provided with a first sub-pixel 311, and another partial region except the partial region provided with the first sub-pixel 311 is disposed as a blank region. A partial region of the second pixel unit 32 is provided with a second sub-pixel 321, and another partial region except the partial region provided with the second sub-pixel 321 is disposed as a blank region. A partial region of the third pixel unit 33 is provided with a third sub-pixel 331, and another partial region except the partial region provided with the third sub-pixel 331 is disposed as a blank region. That is, the first pixel unit includes only the first sub-pixel 311, the second pixel unit 32 includes only the second sub-pixel 321, and the third pixel unit 33 includes only the third sub-pixel 331. That is, the sub-pixels of the adjacent second pixel groups are spaced apart from each other by a blank region. That is, the sub-pixels within the same second pixel group are adjacent to each other, and the sub-pixels of the adjacent second pixel groups are spaced far apart. The ratio of the areas occupied by the first sub-pixel 311, the second sub-pixel 321, and the third sub-pixel 331 provided in the first pixel unit 31, the second pixel unit 32, and the third pixel unit 33, respectively, ensures the light emitting effect while the blank regions in the first pixel unit 31, the second pixel unit 32, and the third pixel unit 33 ensures the transmittance, which is suitable to the region of the under-display camera.

In an embodiment, as shown in FIG. 4, the display panel includes only a second pixel group, i.e., the second pixel group is disposed in all of display regions of the display panel. The first pixel unit 31, the second pixel unit 32, and the third pixel unit 33 of the second pixel group all include only one type of sub-pixel, i.e., the first pixel unit 31 includes the first sub-pixel 311, the second pixel unit 32 includes the second sub-pixel 321, and the third pixel unit 33 includes the third sub-pixel 331.

In an embodiment, as shown in FIG. 3, the display panel includes only a first pixel group, i.e., the first pixel group is disposed in all display regions of the display panel. The first pixel unit 21, the second pixel unit 22, and the third pixel unit 23 of the first pixel group each include three types of sub-pixels.

Figure 6:
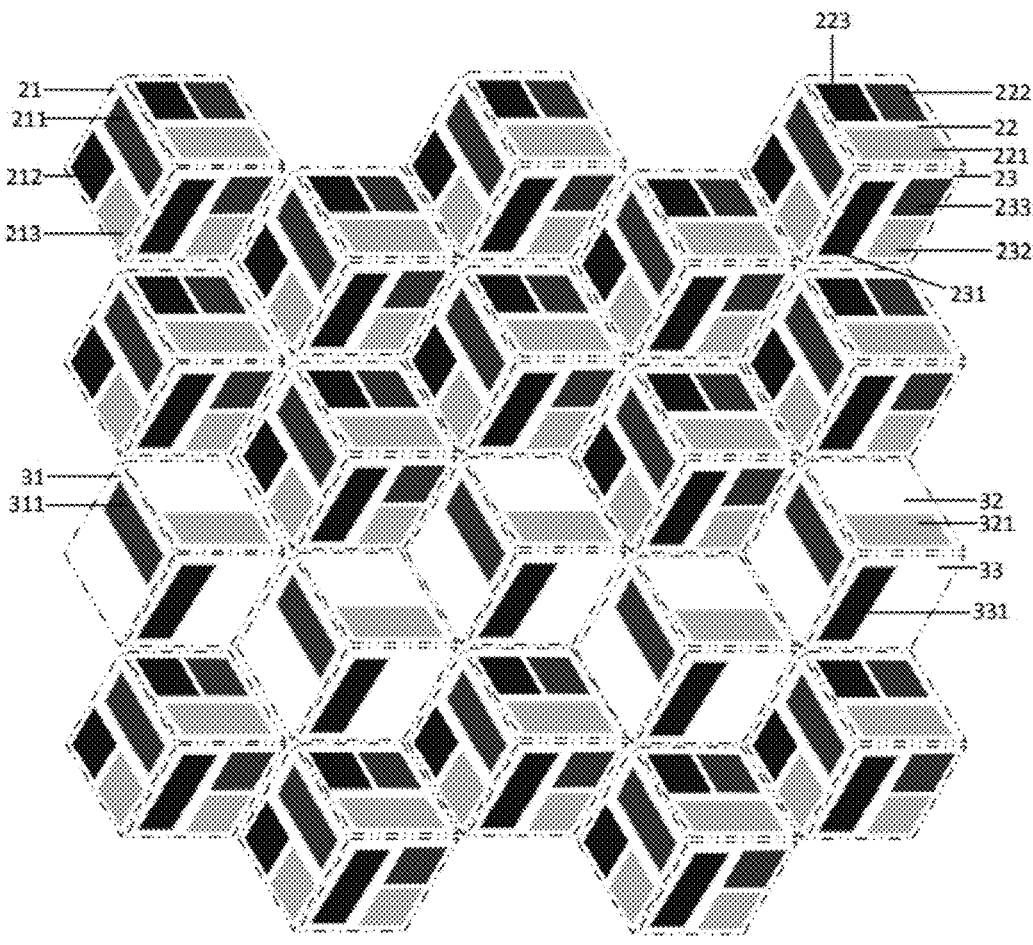
FIG. 6 is a schematic diagram of a display panel composed of a first pixel group and a second pixel group according to an embodiment of the present disclosure.

In another embodiment, as shown in FIG. 6, the display panel includes a first pixel group and a second pixel group at the same time, where the first pixel group and the second pixel group have the same area. When a partial region of the display panel is provided with a functional component, the second pixel group is provided in a display region having the functional component on the display panel, and the first pixel group is provided in a display region having no functional component on the display panel. The functional component is provided on the display panel, including but not limited to the under-display camera. A blank area is introduced to the second pixel group provided in the display region having the functional component, and the transmittance of the display region is better, so that the effect of the functional component is better and the light emitting effect of the under-display camera is ensured. In addition, if an area of the pixel of the display region having the functional component is reduced with respect to that of the other region to increase the blank region, and the smaller pixel require a higher light emitting efficiency, long-time use will result in a faster brightness attenuation in the display region having the functional component than in the other region. Different from this, introduction of the second pixel group in the embodiments increases the blank region by directly reducing a portion of the sub-pixels rather than reducing the area of each of the sub-pixels, thereby avoiding a problem of different brightness attenuation of the different regions. It should be noted that each of the sub-pixels includes not only a light emitting region of each of color pixels, but also a pixel connection region of an adjacent light emitting region, and the size of the pixel connection region is related to the shape of the sub-pixel, that is, the outer contour. Therefore, in order to ensure that when the number of subpixels in the second pixel group decreases to increase the blank area, the pixel light-emitting area does not decrease proportionally, at least two sub-pixels in the same pixel unit (the first pixel unit, the second pixel unit, and the third pixel unit) in the first pixel group have different shapes.

The total of shapes and areas of the sub-pixels with different colors included in the first pixel group are the same, and the shape and area of the first sub-pixel 311 of the first pixel unit 31, the second sub-pixel 321 of the second pixel unit 32, and the third sub-pixel 331 of the third pixel unit 33 in the second pixel group are the same, thereby ensuring an uniform and stable light emitting effect of the entire display panel.

In an embodiment, the first sub-pixel 211 of the first pixel unit 21 of the first pixel group and the first sub-pixel 311 of the first pixel unit 31 of the second pixel group have the same shape and area; the second sub-pixel 221 of the second pixel unit 22 of the first pixel group and the second sub-pixel 321 of the second pixel unit 32 of the second pixel group have the same shape and area; and the third sub-pixel 231 of the third pixel unit 23 of the first pixel group and the third sub-pixel 331 of the third pixel unit 33 of the second pixel group have the same shape and area. That is, with respect to the first pixel group, the second pixel group reserves only the first sub-pixel 311 of the first pixel unit 31, the second sub-pixel 321 of the second pixel unit 32, and the third sub-pixel 331 of the third pixel unit 33.

Since the display region in which the second pixel group is disposed needs to provide a certain transmittance for the under-display camera, the second pixel group has scooped out some of the sub-pixels therein with respect to the first pixel group, but the remaining sub-pixels of the second pixel group have the same settings as the corresponding sub-pixels in the first pixel group. Therefore, the adjustment of the processes can be minimized in preparing the first pixel group and the second pixel group.

In addition, when the display panel is provided with the first pixel group and the second pixel group at the same time, the light transmittance of the display region having the functional component may be adjusted by adjusting parameters such as the shape and area of each of the sub-pixels in the pixel groups. It should be noted that, as shown in FIG. 6, the size and area of the first pixel group and the second pixel group as well as the size and area of the sub-pixels included therein are the same, except that a portion of sub-pixels in the first pixel group do not exist in the second pixel group and the sub-pixels that does not exist in the second pixel group has a different shape from the reserved sub-pixels.

For example, a distribution state shown in FIG. 6 is taken for example. The area of each of the sub-pixels of each of the pixel units in the first pixel group is set to be the same, each of the pixel groups is the minimum unit for the display panel to emit light, and all of the first sub-pixel, the second sub-pixel, and the third sub-pixel included in the first pixel group have the same area. All of the first sub-pixel, the second sub-pixel, and the third sub-pixel included in the second pixel group have the same area, but a width of each of two sub-pixels that do not exist in the second pixel group is half of a width of the reserved sub-pixel. Compared with the first pixel group, the number of the sub-pixels included in the second pixel group is reduced by ⅔. However, since the sub-pixels that do not exist in the second pixel group has a different shape from the reserved sub-pixel and the ratio and area of the pixel connection region included in the corresponding sub-pixel are different, the total light emitting area of the corresponding sub-pixels is not correspondingly reduced by ⅔, but is reduced by only about ½. Therefore, both the transmittance of the under-display camera and the light emitting effect are ensured. It should be noted that parameters such as the shape and area of each of the sub-pixels in the pixel group may be freely set according to display requirements and be not specifically limited in the embodiment.

An embodiment of the present disclosure provides a display device including the display panel according to any one of the foregoing embodiments.

In an embodiment, a display panel includes a plurality of pixel groups arranged in an array, where the pixel groups include:

a first pixel unit, a partial region of which is provided with a first sub-pixel;

a second pixel unit, a partial region of which is provided with a second sub-pixel; and a third pixel unit, a partial region of which is provided with a third sub-pixel;

where the first sub-pixel, the second sub-pixel, and the third sub-pixel have different colors, and any one of the first sub-pixel, the second sub-pixel, and the third sub-pixel is adjacent to other sub-pixels.

In an embodiment, the first sub-pixel, the second sub-pixel, and the third sub-pixel have the same shape and area.

In an embodiment, other partial region of the first pixel unit is provided with a complementing second sub-pixel and a complementing third sub-pixel; other partial region of the second pixel unit is provided with a compensating first sub-pixel and a compensating third sub-pixel; and other partial region of the third pixel unit is provided with a padding first sub-pixel and a padding second sub-pixel.

In an embodiment, the complementing second sub-pixel of the first pixel unit, the compensating third sub-pixel of the second pixel unit, and the padding first sub-pixel of the third pixel unit have the same shape and area; and the complementing third sub-pixel of the first pixel unit, the compensating first sub-pixel of the second pixel unit, and the padding second sub-pixel of the third pixel unit have the same shape and area.

In an embodiment, another partial region of the first pixel unit is disposed as a blank region; another partial region of the second pixel unit is disposed as a blank region; and another partial region of the third pixel unit is disposed as a blank region.

In an embodiment, the pixel groups include a first pixel group and a second pixel group;

other partial region of the first pixel unit of the first pixel group is provided with a complementing second sub-pixel and a complementing third sub-pixel; other partial region of the second pixel unit of the first pixel group is provided with a compensating first sub-pixel and a compensating third sub-pixel; and other partial region of the third pixel unit of the first pixel group is provided with a padding first sub-pixel and a padding second sub-pixel; and another partial region of the first pixel unit of the second pixel group is disposed as a blank region; another partial region of the second pixel unit of the second pixel group is disposed as a blank region; and another partial region of the third pixel unit of the second pixel group is disposed as a blank region.

In an embodiment, the first sub-pixel of the first pixel unit of the first pixel group and the first sub-pixel of the first pixel unit of the second pixel group have the same shape and area; the second sub-pixel of the second pixel unit of the first pixel group and the second sub-pixel of the second pixel unit of the second pixel group have the same shape and area; and the third sub-pixel of the third pixel unit of the first pixel group and the third sub-pixel of the third pixel unit of the second pixel group have the same shape and area.

In an embodiment, an outer contour of each of the pixel groups is set as a regular hexagon.

In an embodiment, each of the pixel groups is equally divided into the first pixel unit, the second pixel unit, and the third pixel unit.

In the foregoing embodiments, different embodiments are described in different emphasis. A portion that is not described in detail in an embodiment may refer to related descriptions in another embodiment.

Any combination of the technical features in the foregoing embodiments may be performed. For brevity of description, all possible combinations of the technical features in the foregoing embodiments are not described. However, as long as there is no contradiction in the combinations of the technical features, the combinations should be considered as falling within the scope described in this specification.

The display panel and the display panel provided in the embodiments of the present disclosure are described in detail above. Specific embodiments are used herein to describe a principle and an implementation of the present disclosure. The description of the foregoing embodiments is merely used to help understand a method and a core idea of the present disclosure. In addition, a person skilled in the art may make changes in a specific implementation manner and an application scope according to an idea of the present disclosure. In conclusion, content of this specification should not be construed as a limitation on the present disclosure.

What is claimed is:

1. A display panel, comprising a plurality of pixel groups arranged in an array, wherein each of the pixel groups comprises:

a first pixel unit, a partial region of which is provided with a first sub-pixel;

a second pixel unit, a partial region of which is provided with a second sub-pixel; and a third pixel unit, a partial region of which is provided with a third sub-pixel;

wherein the first sub-pixel, the second sub-pixel, and the third sub-pixel have different colors, and any one of the first sub-pixel, the second sub-pixel, and the third sub-pixel is adjacent to other sub-pixels; the first sub-pixel, the second sub-pixel, and the third sub-pixel have the same shape and area; and each of the pixel groups is equally divided into the first pixel unit, the second pixel unit, and the third pixel unit; and wherein the pixel groups comprise a first pixel group and a second pixel group;

wherein other partial region of the first pixel unit of the first pixel group is provided with a complementing second sub-pixel and a complementing third sub-pixel; other partial region of the second pixel unit of the first pixel group is provided with a compensating first sub-pixel and a compensating third sub-pixel; and other partial region of the third pixel unit of the first pixel group is provided with a padding first sub-pixel and a padding second sub-pixel;

wherein another partial region of the first pixel unit of the second pixel group is disposed as a blank region; another partial region of the second pixel unit of the second pixel group is disposed as a blank region; and another partial region of the third pixel unit of the second pixel group is disposed as a blank region; and wherein at least two sub-pixels of the first pixel unit of the first pixel group have different shapes; at least two sub-pixels of the second pixel unit of the first pixel group have different shapes; and at least two sub-pixels of the third pixel unit of the first pixel group have different shapes; and wherein all of the first sub-pixel, the compensating first sub-pixel, and the padding first sub-pixel of the first pixel group are sub-pixels having the same color; all of the second sub-pixel, the complementing second sub-pixel, and the padding second sub-pixel of the first pixel group are sub-pixels having the same color; and all of the third sub-pixel, the complementing third sub-pixel, and the compensating third sub-pixel of the first pixel group are sub-pixels having the same color.

2. The display panel of claim 1, wherein the complementing second sub-pixel of the first pixel unit, the compensating third sub-pixel of the second pixel unit, and the padding first sub-pixel of the third pixel unit have the same shape and area; and the complementing third sub-pixel of the first pixel unit, the compensating first sub-pixel of the second pixel unit, and the padding second sub-pixel of the third pixel unit have the same shape and area.

3. A display panel, comprising a plurality of pixel groups arranged in an array, wherein each of the pixel groups comprises:

a first pixel unit, a partial region of which is provided with a first sub-pixel;

a second pixel unit, a partial region of which is provided with a second sub-pixel; and a third pixel unit, a partial region of which is provided with a third sub-pixel;

wherein the first sub-pixel, the second sub-pixel, and the third sub-pixel have different colors, and any one of the first sub-pixel, the second sub-pixel, and the third sub-pixel is adjacent to other sub-pixels;

wherein the pixel groups comprise a first pixel group and a second pixel group;

wherein other partial region of the first pixel unit of the first pixel group is provided with a complementing second sub-pixel and a complementing third sub-pixel; other partial region of the second pixel unit of the first pixel group is provided with a compensating first sub-pixel and a compensating third sub-pixel; and other partial region of the third pixel unit of the first pixel group is provided with a padding first sub-pixel and a padding second sub-pixel;

wherein another partial region of the first pixel unit of the second pixel group is disposed as a blank region; another partial region of the second pixel unit of the second pixel group is disposed as a blank region; and another partial region of the third pixel unit of the second pixel group is disposed as a blank region; and wherein at least two sub-pixels of the first pixel unit of the first pixel group have different shapes; at least two sub-pixels of the second pixel unit of the first pixel group have different shapes; and at least two sub-pixels of the third pixel unit of the first pixel group have different shapes; and wherein all of the first sub-pixel, the compensating first sub-pixel, and the padding first sub-pixel of the first pixel group are sub-pixels having the same color; all of the second sub-pixel, the complementing second sub-pixel, and the padding second sub-pixel of the first pixel group are sub-pixels having the same color; and all of the third sub-pixel, the complementing third sub-pixel, and the compensating third sub-pixel of the first pixel group are sub-pixels having the same color.

4. The display panel of claim 3, wherein the first sub-pixel, the second sub-pixel, and the third sub-pixel have the same shape and area.

5. The display panel of claim 3, wherein the complementing second sub-pixel of the first pixel unit, the compensating third sub-pixel of the second pixel unit, and the padding first sub-pixel of the third pixel unit have the same shape and area; and the complementing third sub-pixel of the first pixel unit, the compensating first sub-pixel of the second pixel unit, and the padding second sub-pixel of the third pixel unit have the same shape and area.

6. The display panel of claim 3, wherein the first sub-pixel of the first pixel unit of the first pixel group and the first sub-pixel of the first pixel unit of the second pixel group have the same shape and area; the second sub-pixel of the second pixel unit of the first pixel group and the second sub-pixel of the second pixel unit of the second pixel group have the same shape and area; and the third sub-pixel of the third pixel unit of the first pixel group and the third sub-pixel of the third pixel unit of the second pixel group have the same shape and area.

7. The display panel of claim 3, wherein the sub-pixel comprises a light emitting region and a pixel connection region connected to an adjacent sub-pixel.

8. The display panel of claim 3, wherein an outer contour of each of the pixel groups is set as a regular hexagon.

9. The display panel of claim 8, wherein each of the pixel groups is equally divided into the first pixel unit, the second pixel unit, and the third pixel unit.

10. The display panel of claim 8, wherein the plurality of pixel groups are arranged in a honeycomb dot-like array.

11. The display panel of claim 3, wherein the first sub-pixel is a red sub-pixel, the second sub-pixel is a green sub-pixel, and the third sub-pixel is a blue sub-pixel.

12. A display device, comprising a display panel comprising a plurality of pixel groups arranged in an array, wherein each of the pixel groups comprises:

a first pixel unit, a partial region of which is provided with a first sub-pixel;

a second pixel unit, a partial region of which is provided with a second sub-pixel; and a third pixel unit, a partial region of which is provided with a third sub-pixel;

wherein the first sub-pixel, the second sub-pixel, and the third sub-pixel have different colors, and any one of the first sub-pixel, the second sub-pixel, and the third sub-pixel is adjacent to other sub-pixels;

wherein the pixel groups comprise a first pixel group and a second pixel group, wherein;

wherein other partial region of the first pixel unit of the first pixel group is provided with a complementing second sub-pixel and a complementing third sub-pixel; other partial region of the second pixel unit of the first pixel group is provided with a compensating first sub-pixel and a compensating third sub-pixel; and other partial region of the third pixel unit of the first pixel group is provided with a padding first sub-pixel and a padding second sub-pixel;

wherein another partial region of the first pixel unit of the second pixel group is disposed as a blank region; another partial region of the second pixel unit of the second pixel group is disposed as a blank region; and another partial region of the third pixel unit of the second pixel group is disposed as a blank region; and wherein at least two sub-pixels of the first pixel unit of the first pixel group have different shapes; at least two sub-pixels of the second pixel unit of the first pixel group have different shapes; and at least two sub-pixels of the third pixel unit of the first pixel group have different shapes; and wherein all of the first sub-pixel, the compensating first sub-pixel, and the padding first sub-pixel of the first pixel group are sub-pixels having the same color; all of the second sub-pixel, the complementing second sub-pixel, and the padding second sub-pixel of the first pixel group are sub-pixels having the same color; and all of the third sub-pixel, the complementing third sub-pixel, and the compensating third sub-pixel of the first pixel group are sub-pixels having the same color.

* * * * *